(12) United States Patent
Ono et al.

(10) Patent No.: US 8,419,001 B2
(45) Date of Patent: Apr. 16, 2013

(54) METHOD AND JIG FOR HOLDING SILICON WAFER

(75) Inventors: Toshiaki Ono, Tokyo (JP); Yumi Hoshino, Tokyo (JP)

(73) Assignee: Sumco Corporation, Tokyo (JP)

( * ) Notice: Subject to any disclaimer, the term of this patent is extended or adjusted under 35 U.S.C. 154(b) by 496 days.

(21) Appl. No.: 12/311,747

(22) PCT Filed: Oct. 12, 2007

(86) PCT No.: PCT/JP2007/069918
§ 371 (c)(1),
(2), (4) Date: Apr. 10, 2009

(87) PCT Pub. No.: WO2008/047697
PCT Pub. Date: Apr. 24, 2008

(65) Prior Publication Data
US 2010/0025909 A1    Feb. 4, 2010

(30) Foreign Application Priority Data
Oct. 13, 2006   (JP) .................................. 2006-280510

(51) Int. Cl.
*H01L 21/683*      (2006.01)
*B24B 41/06*       (2006.01)

(52) U.S. Cl.
USPC .......................................... 269/104; 451/365

(58) Field of Classification Search ................. 269/104, 269/105, 903, 909; 451/384, 390, 364, 365, 451/386, 391
See application file for complete search history.

(56) References Cited

U.S. PATENT DOCUMENTS

| | | | |
|---|---|---|---|
| 4,190,683 A * | 2/1980 | Davies et al. | 427/130 |
| 4,350,116 A * | 9/1982 | Grandia et al. | 269/903 |
| 5,779,797 A | 7/1998 | Kitano | |
| 5,938,512 A | 8/1999 | Takei et al. | |
| 2003/0230237 A1 | 12/2003 | Cheng et al. | |
| 2004/0175878 A1 | 9/2004 | Takagi | |
| 2006/0027171 A1 | 2/2006 | Hsu et al. | |
| 2006/0208434 A1 | 9/2006 | Nakada et al. | |

FOREIGN PATENT DOCUMENTS

| | | |
|---|---|---|
| JP | 8-181083 | 7/1996 |
| JP | 9-139352 | 5/1997 |
| JP | 11-54598 | 2/1999 |
| JP | 2002-33378 | 1/2002 |
| JP | 2003-173971 | 6/2003 |
| TW | 1226078 | 1/2005 |

* cited by examiner

*Primary Examiner* — Hadi Shakeri
(74) *Attorney, Agent, or Firm* — Clark & Brody

(57) ABSTRACT

Provided are a method and a jig for holding a silicon wafer, which are applied to the production of the silicon wafer having {110} or {100} plane as its principal surface, in which the silicon wafer is held while a silicon wafer holding positions are properly defined at wafer edge regions relative to the reference direction as being from the center of the silicon wafer toward <110> in crystal orientation in parallel to the wafer surface. In handling the silicon wafer, generation of contact scratches is suppressed as little as possible, and a fracture which is caused by development of the crack initiating from easily generated contact scratches can be prevented in the silicon wafer, particularly in the silicon wafer having {110} plane as its principal surface.

3 Claims, 3 Drawing Sheets

METHOD AND JIG FOR HOLDING SILICON WAFER

TECHNICAL FIELD

The present invention relates to a method for holding a silicon wafer when the silicon wafer is handled in a silicon wafer conveying step or a heat treatment process in which a vertical boat is used, and a holding jig used on these occasions.

BACKGROUND ART

In producing the silicon wafer, there are many processes which are performed while the back side of the silicon wafer is held in contact with a supporting member or a suction member and kept in a horizontal position. Examples of the processes include a silicon wafer conveying step, a heat treatment process in which a vertical boat is used, an RTA (rapid thermal annealing) process, a single-feed type epitaxial growth process, and an SOI heat treatment process. The processes are performed while the silicon wafer back side is held in contact with the supporting member or the suction member and kept in a horizontal position.

Recently, since a highly integrated device is produced in a generation of stepped-up miniaturization with increasing diameter of the wafer, it is necessary to decrease the number of scratches to be caused by the contact between the wafer and the supporting member as few as possible. Therefore, in handling the silicon wafer, there arise unavoidable circumstances to adopt an edge handling system in which only edges are held while the silicon wafer is not held at its back side by the suction member and the like.

For example, Japanese Patent Application Publication (Kokai) No. 2002-33378 discloses a handling apparatus including an end-effecting member which is freely movable in a vertical direction and at least three chuck-finger members which are attached to the end-effecting member and which have lower end portions used as a flange portion. An upper surface portion of the flange portion of the chuck-finger members is formed into a tapered surface, the end-effecting member is lowered and set sideways in the vicinity of wafer circumference from above the wafer, and the chuck-finger members are closed to hold the wafer on its tapered surface. It is said that the thin wafer which is hardly held by a conventional back side suction method or clamping method can stably be handled without generating deformation or fracture of the wafer since force is not applied to the wafer from the chuck-finger members.

On the other hand, conventionally a silicon wafer having crystal orientation <100> or <111> is mainly used to produce a semiconductor element. Recently, since carrier mobility of the semiconductor element largely depends on the crystal orientation of the wafer, attention focuses on the use of a silicon wafer having crystal orientation <110> in response to demands on a high-speed operation of the semiconductor element, and needs for the silicon wafer having the crystal orientation <110> are growing. This is because the use of the silicon wafer having the crystal orientation <110> can increase the carrier mobility to expect the achievement of the high-speed operation such as switching speed in the semiconductor element.

However, in a silicon wafer having crystal {110} plane as its principal surface, when compared with a silicon wafer having crystal {100} plane as its principal surface which is currently a mainstream wafer, contact scratches are easily generated in an outer circumferential portion, and unfortunately the wafer is easily fractured by development of the crack initiated from contact scratches. This is not limited to the silicon wafer having {110} plane as its principal surface, but a silicon wafer having {100} plane as its principal surface is also somewhat easily fractured in a specific direction, compared with other directions.

The edge handling alone disclosed in Japanese Patent Application Publication (Kokai) No. 2002-33378 is an ineffective countermeasure against such fracture caused by contact scratches.

DISCLOSURE OF INVENTION

The present invention has been made in view of the foregoing, and an object thereof is to provide a silicon wafer holding method in which the wafer fracture caused by development of the crack initiated from easily generated contact scratches can be prevented in the silicon wafer, particularly in the silicon wafer having {110} plane as its principal surface while the generation of the contact scratch caused by the contact between the wafer and the end-effecting member or supporting member is reduced as little as possible in handling the wafer in the processes such as a silicon wafer conveying step, a heat treatment process in which a vertical boat is used, an RTA process, a single-feed type epitaxial growth process, and an SOI heat treatment process, and a holding jig used in applying the holding method.

The problem that fracture is easily generated in the silicon wafer having {110} plane as its principal surface is attributed to the fact that the silicon wafer having {110} plane as its principal surface has {111} plane which is a cleavage plane in parallel to <110> axis. That is, in cases where a silicon wafer holding position in the wafer edge portion is in the direction of <112> in parallel to {111} plane or in a direction close to the direction of <112>, the contact scratch is easily introduced into the outer circumferential portion of the wafer by the contact with the holding jig, and the crack is developed inwards starting from the contact scratch even if an extremely small external force is applied to the wafer, thereby generating the fracture of the wafer.

In order to achieve the above object, the inventors made investigations to prevent the fracture to be easily generated in the silicon wafer, particularly in the silicon wafer having {110} plane as its principal surface. As a result, the inventors reached an idea that, while the edge handling is applied, the wafer is held in a direction in which the fracture is not easily generated, avoiding the direction accompanying the fracture.

The inventors made feasibility study and investigated effects of the idea. As a result, the inventors confirmed that the holding positions can properly be defined at the wafer edge portion to hold the wafer when the crystal plane and crystal orientation of the silicon single crystal are considered in association with a cleavage plane, and that the prevention of the fracture caused by contact scratches, which is the primary object, could be achieved by holding the wafer at the defined positions, whereby the inventors completed the present invention.

The summary of the present invention includes a silicon wafer holding method described below in (1) or (2) and a holding jig described below in (3) or (4) which is used in applying the silicon wafer holding method.

(1) A method for holding a silicon wafer having {110} plane as its principal surface is characterized in that the silicon wafer is held in wafer edge regions except for those regions each defined by the direction range: 20° to 40°; 140° to 160°; 200° to 220°; and 320° to 340° respectively, in terms of clockwise direction relative to the reference direction as being from the center of the silicon wafer toward <100> in parallel to the wafer surface.

As used herein, "the silicon wafer having {110} plane as its principal surface" means a silicon wafer in which the wafer surface is formed to have {110} plane where a device is processed, that is, a so-called device active region can be formed on {110} plane when the wafer is used to fabricate the device.

In the silicon wafer holding method described in (1), desirably the silicon wafer having {110} plane as its principal surface is held in at least two wafer edge regions among those regions each defined by the direction range: 55° to 80°; 100° to 125°; 235° to 260°; and 280° to 305° respectively, in terms of clockwise direction relative to the reference direction as being from the center of the silicon wafer toward <100> in parallel to the wafer surface. Therefore, the effect of preventing the generation of the fracture is further improved in the silicon wafer.

(2) A method for holding a silicon wafer having {100} plane as its principal surface is characterized in that the silicon wafer is held in wafer edge regions except for those regions each defined by the direction range: 0° to 10°; 80° to 100°; 170° to 190°; 260° to 280°; and 350° to 360° respectively, in terms of clockwise direction relative to the reference direction as being from the center of the silicon wafer toward <110> in parallel to the wafer surface.

As used herein, "the silicon wafer having {100} plane as its principal surface" means a silicon wafer in which the wafer surface is formed so as to have {100} plane where a device is processed, that is, a so-called device active region can be formed on {100} plane when the wafer is used to construct the device.

(3) A silicon wafer holding jig is characterized in that a silicon wafer having {110} plane as its principal surface is held in wafer edge regions except for those regions each defined by the direction range: 20° to 40°; 140° to 160°; 200° to 220°; and 320° to 340° respectively, in terms of clockwise direction relative to the reference direction as being from the center of the silicon wafer toward <100> in parallel to the wafer surface.

In the silicon wafer holding jig described in (3), desirably the silicon wafer having {110} plane as its principal surface is held in at least two wafer edge regions among those regions each defined by the direction range: 55° to 80°; 100° to 125°; 235° to 260°; and 280° to 305° respectively, in terms of clockwise direction relative to the reference direction as being from the center of the silicon wafer toward <100> in parallel to the wafer surface. Therefore, the effect of preventing the generation of the fracture is further improved in the silicon wafer.

(4) A silicon wafer holding jig is characterized in that a silicon wafer having {100} plane as its principal surface is held in wafer edge regions except for those regions each defined by the direction range: 0° to 10°; 80° to 100°; 170° to 190°; 260° to 280°; and 350° to 360° respectively, in terms of clockwise direction relative to the reference direction as being from the center of the silicon wafer toward <110> in parallel to the wafer surface.

According to the silicon wafer holding method of the invention, the generation of contact scratches caused by the contact with the end-effecting member or the like is suppressed as few as possible in handling the wafer, and the fracture caused by contact scratches, which can be easily generated, can be prevented in the silicon wafer, particularly in the silicon wafer having {110} plane as its principal surface. The silicon wafer holding method can easily be performed using the silicon wafer holding jig of the invention.

BEST MODES FOR CARRYING OUT THE INVENTION

The silicon wafer holding methods of the present invention described in (1) and (2), and the holding jigs of the invention described in (3) and (4) which are used in performing the methods, will be described with reference to the drawings.

The silicon wafer holding method described in (1) as above is a method for holding a silicon wafer having {110} plane as its principal surface, in which the silicon wafer is held in wafer edge regions except for those regions each defined by the direction range: 20° to 40°; 140° to 160°; 200° to 220°; and 320° to 340° respectively, in terms of clockwise direction relative to the reference direction from the center point of the silicon wafer toward <100> in parallel to the wafer surface.

The holding method can be used when the silicon wafer is handled while kept in a horizontal position in the processes such as a silicon wafer conveying step, a heat treatment process in which a vertical boat is used, an RTA process, a single-feed type epitaxial growth process, and an SOI heat treatment process. The same holds true for the silicon wafer holding method described in (2) as above.

The reason why the silicon wafer holding method of the invention is aimed at the silicon wafer having {110} plane as its principal surface is that, since the silicon wafer has {111} plane as being cleavage planes in parallel to <110> axis, a contact scratch is easily introduced in cases where holding positions in the wafer edge portion lie in directions of <112> or close to in parallel to {111} plane, and the crack develops inwards from the contact scratch to fracture the wafer even if an extremely small external force is applied to the silicon wafer.

In the holding method of the invention, the silicon wafer is held in specific edge regions except for the above-described wafer edge regions relative to the reference direction as being from the center of the silicon wafer toward <100>, for example toward a direction [001], in parallel to the wafer surface. As used herein, "edge region" of wafer means an edge (wafer circumferential end face) in an outer circumference of the wafer and its vicinity.

Figure 1:
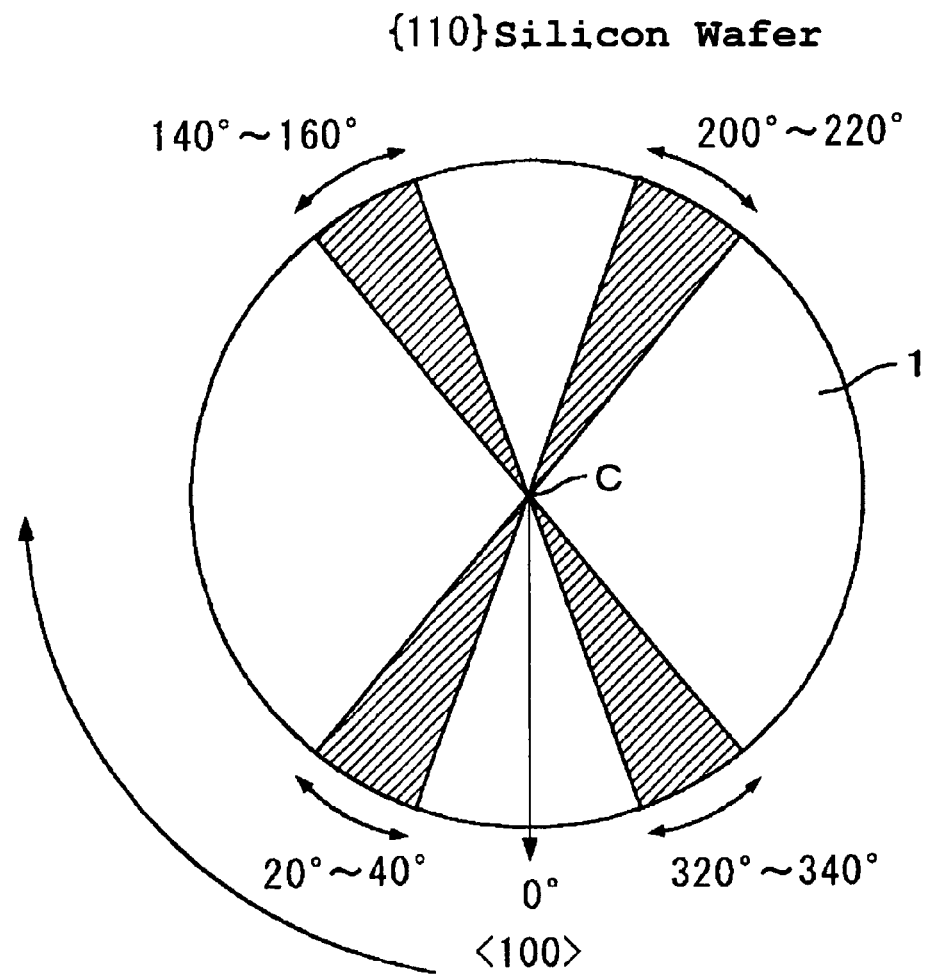
FIG. 1 is a view schematically showing regions where a silicon wafer having {110} plane as its principal surface is held.

FIG. 1 is a view schematically showing regions where the silicon wafer having {110} plane as its principal surface is held. Referring to FIG. 1, there are shown diagonally shaded fan-shaped regions of wafer surface, each of which is defined by the direction range: 20° to 40°; 140° to 160°; 200° to 220°; and 320° to 340° respectively, in terms of clockwise direction relative to the reference direction (0°) indicated by an arrow in FIG. 1 as being from the center "C" of the wafer 1 toward <100> in crystal orientation. In these shaded areas, the fracture caused by the contact scratches is easily generated, and edge regions of these fan-shaped regions are the ones where the wafer holding (handling) should be avoided.

In the holding method of the invention, the wafer is held in the wafer edge regions except for those regions where the wafer holding (handling) should be avoided, that is, being held in the edge regions of the wafer surface which are not diagonally shaded.

The reason why the silicon wafer is held in the edge regions of the wafer surface which are not diagonally shaded is that the crack develops inwards starting from any of contact scratches to easily fracture the wafer even if an extremely small external force is applied to the wafer (including its edge region) in wafer surface regions shaded diagonally. The reason why the silicon wafer is held in edge regions is that the number of contact scratches is decreased as few as possible. The contact scratch is easily generated in cases where the wafer is handled while a back side of the wafer is held with a supporting member or a suction member.

Positions where the silicon wafer is held in edge regions may be set anywhere as long as the positions exist in the edge regions of the wafer surface which are not diagonally shaded in FIG. 1, and the positions may appropriately be determined according to circumstances in conveying or treating the wafer. The silicon wafer may be held on the whole surface of a relevant edge region. For example, in cases where the wafer is held during the heat treatment in which the vertical boat is used, usually the wafer is held at three or four points in relevant edge regions in consideration of stability of the wafer as being arranged in a horizontal position.

There is no particular limitation to how to hold the wafer in relevant edge regions. For example, as disclosed in Japanese Patent Application Publication (Kokai) No. 2002-33378, the method for holding the wafer edge by means of a tapered surface provided above the supporting member may be used. A method for clamping the neighborhood of the relevant wafer edge is suitably used depending on circumstances in conveying or treating the wafer.

In the silicon wafer holding method described in (1) as above, preferably the silicon wafer having {110} plane as its principal surface is held in at least two wafer edge regions among those each defined by the direction range: 55° to 80°; 100° to 125°; 235° to 260°; and 280° to 305° respectively, in terms of clockwise direction relative to the reference direction as being from the center of the silicon wafer toward <100> in crystal orientation in parallel to the wafer surface. Therefore, the effect on preventing the generation of the fracture is further improved in the silicon wafer.

The reason why the wafer is held in "at least two edge regions" is that the wafer is not stably held in a horizontal position when held in one relevant edge region.

Figure 2:
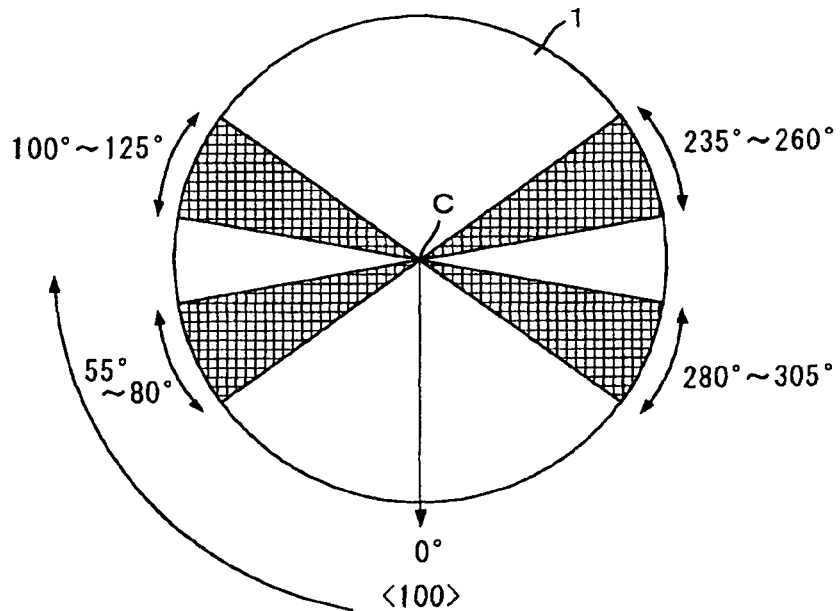
FIG. 2 is a view schematically showing more preferable regions where the silicon wafer having {110} plane as its principal surface is held.

FIG. 2 is a view schematically showing more preferable regions where the silicon wafer having {110} plane as its principal surface is held. Referring to FIG. 2, there are shown fan-shaped regions of wafer surface, each of which is defined by the direction range: 55° to 80°; 100° to 125°; 235° to 260°; and 280° to 305° respectively, in terms of clockwise direction relative to the reference direction as being from the center of the silicon wafer toward <100> in crystal orientation in parallel to the wafer surface, being marked with grating patterns.

The areas marked with grating patterns are located sufficiently away from the fan-shaped region of wafer surface, as diagonally shaded in FIG. 1, where the fracture is easily generated by the extremely small external force, thus the fracture is hardly generated in such areas. Therefore, the areas marked with grating patterns are the ones which are considered to be more preferable edge regions in holding (handling) the wafer.

When the wafer is held in relevant edge regions of the wafer surface, the wafer fracture to be caused by the contact scratches can be assuredly prevented.

The wafer holding positions may be set anywhere as long as the positions are located in the edge regions of the wafer surface marked with grating patterns in FIG. 2. There is no particular limitation to how to hold the wafer in relevant edge regions and, for example, the method for holding the wafer edge by means of a tapered surface and the method for clamping the neighborhood of the wafer edge can be employed.

The silicon wafer holding method described in (2) as above is a method for holding a silicon wafer having {100} plane as its principal surface, in which the silicon wafer is held in wafer edge regions except for those regions each defined by the direction range: 0° to 10°; 80° to 100°; 170° to 190°; 260° to 280°; and 350° to 360° respectively, in terms of clockwise direction relative to the reference direction as being from the center of the silicon wafer toward <110> in crystal orientation in parallel to the wafer surface.

The reason why the holding method described in (2) as above is aimed at the silicon wafer having {100} plane as its principal surface is that in this wafer also, the fracture is somewhat easily generated in a certain direction, compared with other directions in handling.

Figure 3:
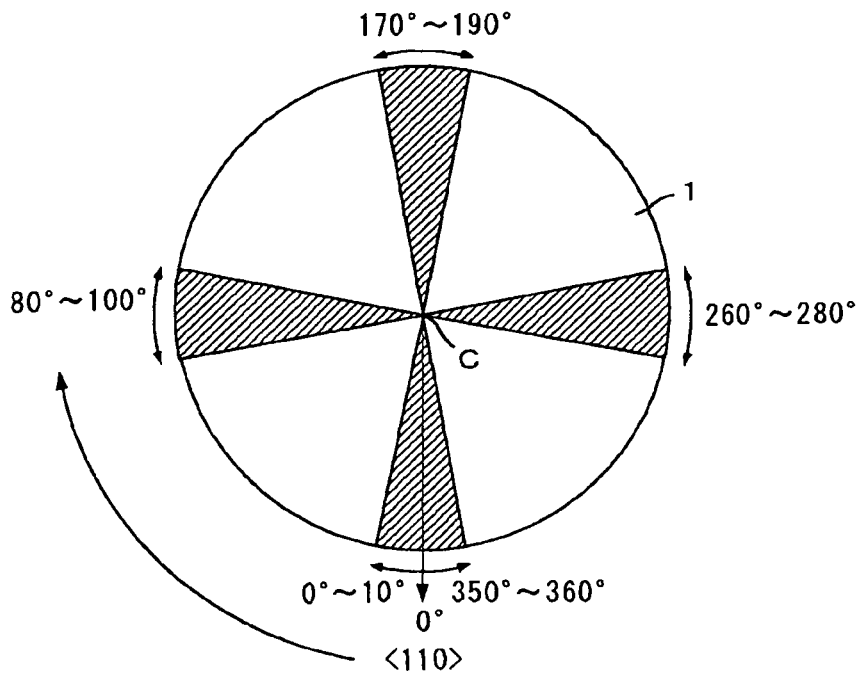
FIG. 3 is a view schematically showing regions where a silicon wafer having {100} plane as its principal surface is held.

FIG. 3 is a view schematically showing regions where the silicon wafer having {100} plane as its principal surface is held. Referring to FIG. 3, there are shown diagonally shaded fan-shaped regions of wafer surface, each of which is defined by the direction range: 0° to 10°; 80° to 100°; 170° to 190°; 260° to 280°; and 350° to 360° respectively, in terms of clockwise direction relative to the reference direction (0°) as being from the center "C" of the wafer 1 toward <110> in crystal orientation in parallel to the wafer surface. The shaded areas are where the fracture is easily generated, and the edge regions of these areas are where the wafer holding (handling) should be avoided.

In the holding method of the invention, the wafer is held in specific wafer edge regions except for those regions where the wafer holding (handling) should be avoided, that is, should be held in edge regions of the wafer surface which are not diagonally shaded.

The reason why the silicon wafer is held in the edge regions of the wafer surface which are not diagonally shaded is that, when the wafer is held in the wafer surface which is diagonally shaded, the wafer is somewhat easily fractured compared with other wafer surface. The reason why the silicon wafer is held in relevant edge regions is that the number of contact scratches is decreased as few as possible. The contact scratch is easily generated in cases where the wafer is handled while a back side of the wafer is held with a supporting member or a suction member.

Positions where the silicon wafer is held in relevant edge regions may be located anywhere as long as the positions exists in the edge regions of the wafer surface which are not diagonally shaded in FIG. 3. There is no particular limitation to how to hold the wafer in relevant edge regions and, for example, the method for holding the wafer edge by means of a tapered surface and the method for clamping the neighborhood of the wafer edge can be employed.

As described above, in the silicon wafer holding method of the invention, the silicon wafer having {110} or {100} plane as its principal surface is held in specific wafer edge regions relative to the reference direction as being from the center of the silicon wafer toward <100> or <110> in crystal orientation in parallel to the wafer surface. In handling the silicon wafer, the generation of the contact scratch caused by the contact with the end-effecting member or supporting member is suppressed as few as possible, and the fracture to be caused by the development of the crack from the contact scratches can be prevented in the silicon wafer, particularly in the silicon wafer having {110} plane as its principal surface.

The holding jigs of the invention described in (3) and (4) as above will be recited below.

The silicon wafer holding jig described in (3) as above is a holding jig, in which a silicon wafer having {110} plane as its principal surface is held in wafer edge regions except for those regions each defined by the direction range: 20° to 40°; 140° to 160°; 200° to 220°; and 320° to 340° respectively, in terms of clockwise direction relative to the reference direction as being from the center of the silicon wafer toward <100> in crystal orientation in parallel to the wafer surface.

The silicon wafer holding jig described in (4) as above is a holding jig, in which a silicon wafer having {100} plane as its principal surface is held in wafer edge regions except for those regions each defined by the direction range: 0° to 10°; 80° to 100°; 170° to 190°; 260° to 280°; and 350° to 360° respectively, in terms of clockwise direction relative to the reference direction as being from the center of the silicon wafer toward <110> in crystal orientation in parallel to the wafer surface.

The holding jigs can be used when the silicon wafer is handled while kept in a horizontal position in the processes such as a silicon wafer conveying step, a heat treatment process in which a vertical boat is used, an RTA process, a single-feed type epitaxial growth process, and an SOI heat treatment process.

The reason why the holding jig described in (3) as above is aimed at the silicon wafer having {110} plane as its principal surface is that, depending on the wafer holding positions, any contact scratch is easily introduced even if an extremely small external force is applied to the wafer in handling the wafer, and the crack develops starting from such a contact scratch to easily fracture the wafer. Particularly, in cases where the wafer is subjected to a high-temperature heat treatment, the wafer is fractured more easily from contact scratches since thermal stress is also applied to the wafer.

The reason why the holding jig described in (4) as above is aimed at the silicon wafer having {100} plane as its principal surface is that in the wafer also, the fracture is somewhat easily generated in a certain direction, compared with other directions.

The reason why the silicon wafer is held in specific edge regions except for those regions (regions of the wafer surface as diagonally shaded in FIG. 1) in the holding jig described in (3) as above is that the wafer is easily fractured starting from contact scratches in the wafer surface as diagonally shaded (see FIG. 1) and the number of contact scratches can be decreased as few as possible by holding the wafer in specific edge regions. The contact scratch is easily generated in cases where the wafer is handled while the back side of the wafer is held with a supporting member or the like.

The reason why the silicon wafer is held in specific edge regions except for those regions (regions of the wafer surface as diagonally shaded in FIG. 3) in the holding jig described in (4) as above is that, when the wafer is held in regions of the wafer surface as diagonally shaded (see FIG. 3), the wafer is somewhat easily fractured compared with cases when held in regions other than those, and the number of contact scratches to be easily generated in handing the wafer can be decreased as few as possible by holding the wafer in specific edge regions.

In the holding jig of the invention, positions where the silicon wafer is held may be located anywhere as long as the positions exist in edge regions of the wafer surface which are not diagonally shaded, and the positions may appropriately be determined in consideration of the stability of the wafer as being kept in a horizontal position. The silicon wafer may be held on the whole surfaces of specific edge regions. There is no particular limitation to how to hold the wafer in relevant edge regions and, for example, the method for holding the wafer edge by means of a tapered surface and the method for clamping the neighborhood of the wafer edge can suitably be used.

In the silicon wafer holding jig described in (3) as above, preferably the silicon wafer having {110} plane as its principal surface is held in at least two wafer edge regions among those regions each defined by the direction range: 55° to 80°; 100° to 125°; 235° to 260°; and 280° to 305° respectively, in terms of clockwise direction relative to the reference direction as being from the center of the silicon wafer toward <100> in crystal orientation in parallel to the wafer surface. Therefore, the effect on preventing the generation of the fracture is further improved in the silicon wafer.

The reason why the wafer is held in "at least two edge regions" is that holding the wafer at one edge region cannot assure the wafer to be stably held in a horizontal direction.

As described above with reference to FIG. 2, specific edge regions are located sufficiently away from the wafer surface areas as diagonally shaded in FIG. 1 where the fracture is easily generated, and the fracture to be caused by contact scratches is hardly generated in such specific edge regions of fan-shaped areas. Therefore, when the wafer is held in such regions, the number of contact scratches to be caused by the contact between the wafer and the supporting member or end-effecting member can be decreased as few as possible.

Figure 4:
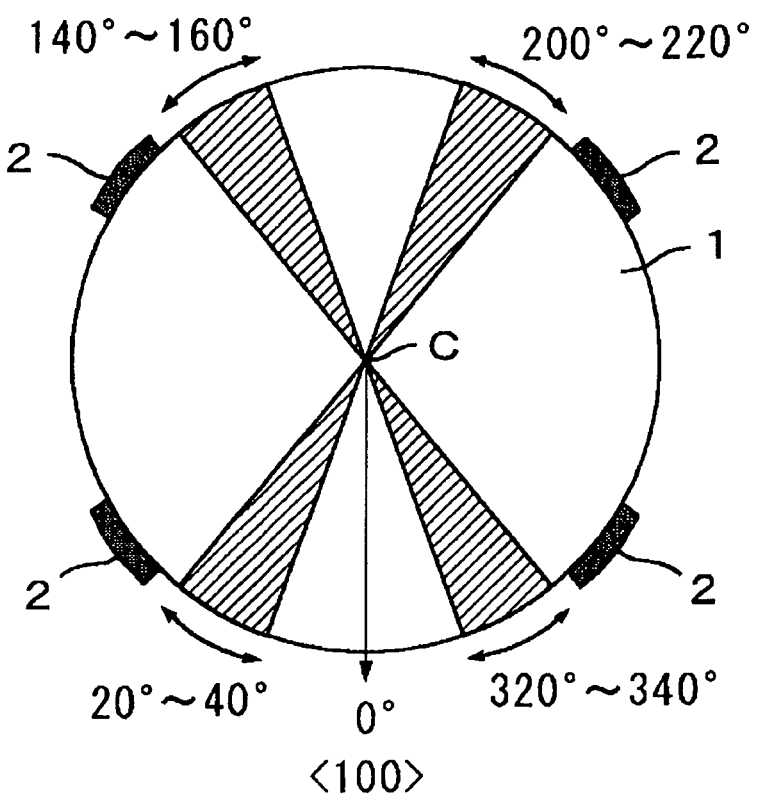
FIG. 4 is a view schematically showing how a wafer is held using a four-point support type holding jig.

FIG. 4 is a view schematically showing how the wafer having {110} plane as its principal surface is held using a four-point support type holding jig as the holding jig according to an embodiment of the invention.

In the embodiment, the holding jig includes four supporting members 2. The supporting members 2 are set in place so as to hold the wafer in wafer edge regions except for those regions where the handling should be avoided, that is, to hold in edge regions of the wafer surface which are not diagonally shaded in FIG. 1 or 3, and the wafer 1 is kept in a horizontal position by the supporting members 2.

In the illustrated example, the supporting member has a tapered upper surface. Alternatively, the supporting member may be configured so as to clamp the neighborhood of the edge.

As described above, the use of the silicon wafer holding jig of the invention can easily make the silicon wafer holding method of the invention applicable.

EXAMPLE

The handling was performed to a 300-mm-diameter silicon wafer having {110} plane as its principal surface and a 300-mm-diameter silicon wafer having {100} plane as its principal surface (hereinafter referred to as (110) wafer and (100) wafer, respectively) while the wafer grasping positions were changed. Then, wafer strength was measured to evaluate likelihood of generating the fracture depending on the wafer grasping positions.

As to the wafer handling, using a mechanism (apparatus) in which handling is carried out by holding the 300-mm-diameter wafer at two positions on side end face thereof (outermost circumference surface of the wafer), operations of grasping and releasing the wafer at two positions, in a symmetrical relation each other with respect to the center of the wafer, on side end face was repeated ten times for each wafer. Then, a three-point bending test was performed to measure a wafer fracture load.

Table 1 shows measurement results for the (110) wafer, and Table 2 shows measurement results for the (100) wafer. In Tables 1 and 2, each of numerical values is the average value of ten wafers.

In Table 1, Nos. 3 to 6 and Nos. 19 to 22 are the cases in which the wafers were held in the edge regions where the handling should be avoided. Other numbers are the cases in which the wafers were held in edge regions defined by the invention, and Nos. 9 to 12 and Nos. 14 to 16 are the cases in which the wafers were held in more preferable edge regions of FIG. 2.

In Table 2, Nos. 1 to 3, Nos. 7 to 11, and Nos. 14 and 15 are the cases in which the wafers were held in the edge regions where the handling should be avoided. Other numbers are the cases in which the wafers were held in edge regions defined by the invention.

The mark "○" in the column of "remarks" indicates the cases in which the wafer was held in the edge regions defined by the invention, the mark "⊚" indicates the cases in which the wafer was held in more preferable edge regions, and the mark "x" indicates the cases in which the wafer was held in edge regions where the handling should be avoided.

[Table 1]

TABLE 1

| | Silicon wafer having {110} plane as its principal surface | | |
|---|---|---|---|
| No. | Handling position (°) (relative to reference direction <100>) | Fracture load (N) (average value of ten wafers) | Remarks |
| 1 | 0, 180 | 338.623 | ○ |
| 2 | 15, 195 | 344.520 | ○ |
| 3 | 20, 200 | 290.421 | X |
| 4 | 25, 205 | 285.620 | X |
| 5 | 35, 215 | 256.523 | X |
| 6 | 40, 220 | 271.563 | X |
| 7 | 45, 225 | 324.857 | ○ |
| 8 | 50, 230 | 389.647 | ○ |
| 9 | 55, 235 | 427.534 | ⊚ |
| 10 | 60, 240 | 425.963 | ⊚ |
| 11 | 70, 250 | 430.649 | ⊚ |
| 12 | 80, 260 | 422.356 | ⊚ |
| 13 | 85, 265 | 356.390 | ○ |
| 14 | 100, 280 | 419.563 | ⊚ |
| 15 | 110, 290 | 427.974 | ⊚ |
| 16 | 125, 305 | 432.967 | ⊚ |
| 17 | 130, 310 | 346.746 | ○ |
| 18 | 135, 315 | 356.375 | ○ |
| 19 | 140, 320 | 284.682 | X |
| 20 | 145, 325 | 263.917 | X |
| 21 | 155, 335 | 252.768 | X |
| 22 | 160, 340 | 291.739 | X |
| 23 | 165, 345 | 322.373 | ○ |

[Table 2]

TABLE 2

| | Silicon wafer having {100} plane as its principal surface of | | |
|---|---|---|---|
| No. | Handling position (°) (relative to reference direction <110>) | Fracture load (N) (average value of ten wafers) | Remarks |
| 1 | 0, 180 | 321.840 | X |
| 2 | 5, 185 | 351.968 | X |
| 3 | 10, 190 | 365.453 | X |

TABLE 2-continued

| | Silicon wafer having {100} plane as its principal surface of | | |
|---|---|---|---|
| No. | Handling position (°) (relative to reference direction <110>) | Fracture load (N) (average value of ten wafers) | Remarks |
| 4 | 15, 195 | 443.940 | ○ |
| 5 | 20, 200 | 428.593 | ○ |
| 6 | 75, 255 | 439.637 | ○ |
| 7 | 80, 260 | 336.846 | X |
| 8 | 85, 265 | 325.832 | X |
| 9 | 90, 270 | 327.637 | X |
| 10 | 95, 275 | 371.589 | X |
| 11 | 100, 280 | 356.053 | X |
| 12 | 105, 285 | 446.205 | ○ |
| 13 | 165, 345 | 425.835 | ○ |
| 14 | 170, 350 | 314.352 | X |
| 15 | 175, 355 | 335.084 | X |

As shown in Table 1, the fracture load was equal to or larger than 322.373 N in cases where the (110) wafer was held in edge regions defined by the invention (mark "○"), and particularly the fracture load was equal to or larger than 419.563 N in cases where the (110) wafer was held in more preferable edge regions (mark "⊚"). On the other hand, the fracture load was equal to or smaller than 291.739 N (252.768 N to 291.739 N) in cases where the (110) wafer was held in edge regions where the handling should be avoided (mark "x"). Thus, when the (110) wafer was held in edge regions where the handling should be avoided, the wafer fracture strength becomes low compared with the case in which the (110) wafer was held in edge regions defined by the invention.

As shown in Table 2, the fracture load was equal to or larger than 425.835 N in cases where the (100) wafer was held in edge regions defined by the invention (mark "○"). On the other hand, the fracture load was equal to or smaller than 371.589 N (314.352 N to 371.589 N) in cases where the (100) wafer was held in edge regions where the handling should be avoided (mark "x") thus the wafer fracture strength was also low.

This is attributed to the following fact that the flaws are introduced into the wafer side end face by repeating the handling there, and the crack easily develops inwards from flaws in a specific plane orientation when the load is applied in the three-point bending test, thereby fracturing the wafer with a low load.

Thus, the brittle fracture of the silicon single crystal is preferentially generated in a specific orientation. Accordingly, in handling the (110) wafer and the (100) wafer, the wafer is handled so as to avoid the plane orientation in which the cleavage fracture is preferentially generated, thereby allowing the cleavage of the wafer to be prevented.

INDUSTRIAL APPLICABILITY

The silicon wafer holding method of the invention is a method for holding the silicon wafer while the silicon wafer holding positions are properly defined in wafer edge regions. In handling the silicon wafer, the generation of the contact scratches is suppressed as little as possible, and the fracture which is caused by development of the crack from contact scratches, which are easily generated, can be prevented in the silicon wafer, particularly in the silicon wafer having {110} plane as its principal surface.

The silicon wafer holding method can easily be applied using the silicon wafer holding jig of the invention. Accordingly, the silicon wafer holding method and holding jig of the invention can widely be applied to the production of the silicon wafer having {110} or {100} plane as its principal surface.

What is claimed is:

1. A method for preventing cleavage cracking when holding a silicon wafer, the method comprising:
   providing a silicon wafer having any of {110} planes as a principal surface thereof, the principal surface including first and second wafer edge regions,
   holding the silicon wafer in the first wafer edge regions, the holding step leaving the second wafer edge regions unsupported, each unsupported second wafer edge region defined by the direction range: 20° to 40°; 140° to 160°; 200° to 220°; and 320° to 340° respectively, in terms of clockwise direction relative to a reference direction as being from the center of the silicon wafer toward <100> in crystal orientation in parallel to the wafer surface, wherein preventing contact with the second wafer edge regions during said holding step prevents cracking along specific planes being susceptible to cleavage cracking.

2. The method according to claim 1, wherein the silicon wafer is held in at least two first wafer edge regions, each of the at least two first wafer edge regions defined by the direction range: 55° to 80°; 100° to 125°; 235° to 260°; and 280° to 305° respectively, in terms of clockwise direction relative to the reference direction as being from the center of the silicon wafer toward <100> in crystal orientation in parallel to the wafer surface.

3. A method for preventing cleavage cracking when holding a silicon wafer, the method comprising:
   providing a silicon wafer having any of {100} planes as a principal surface thereof, the principal surface including first and second wafer edge regions,
   holding the silicon wafer in the first wafer edge regions, the holding step leaving the second wafer edge regions unsupported, each unsupported second wafer edge region defined by the direction range: 0° to 10°; 80° to 100°; 170° to 190°; 260° to 280°; and 350° to 360° respectively, in terms of clockwise direction relative to the reference direction as being from the center of the silicon wafer toward <110> in crystal orientation in parallel to the wafer surface, wherein preventing contact with the second wafer edge regions during said holding step prevents cracking along specific planes being susceptible to cleavage cracking.

\* \* \* \* \*